United States Patent
Yan et al.

(10) Patent No.: US 10,147,596 B2
(45) Date of Patent: *Dec. 4, 2018

(54) METHODS AND SOLUTIONS FOR CLEANING INGAAS (OR III-V) SUBSTRATES

(71) Applicant: Applied Materials, Inc., Santa Clara, CA (US)

(72) Inventors: Chun Yan, San Jose, CA (US); Xinyu Bao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 60 days.

This patent is subject to a terminal disclaimer.

(21) Appl. No.: 15/871,264

(22) Filed: Jan. 15, 2018

(65) Prior Publication Data

US 2018/0138032 A1 May 17, 2018

Related U.S. Application Data

(63) Continuation of application No. 15/340,292, filed on Nov. 1, 2016, now Pat. No. 9,905,412.

(Continued)

(51) Int. Cl.
*H01L 21/02* (2006.01)
*B08B 5/00* (2006.01)
*H01L 21/306* (2006.01)
*H01L 21/67* (2006.01)

(52) U.S. Cl.
CPC .......... *H01L 21/02065* (2013.01); *B08B 5/00* (2013.01); *H01L 21/0243* (2013.01);
(Continued)

(58) Field of Classification Search
CPC ......... H01L 21/02043; H01L 21/02046; H01L 21/02049; H01L 21/02057; H01L 21/0206; H01L 21/02068; H01L 21/31116
See application file for complete search history.

(56) References Cited

U.S. PATENT DOCUMENTS

| 7,235,492 B2 | 6/2007 | Samoilov |
| 7,494,545 B2 | 2/2009 | Lam et al. |

(Continued)

FOREIGN PATENT DOCUMENTS

| EP | 1484794 A1 | 12/2004 |
| JP | 2008-311568 A | 12/2008 |

OTHER PUBLICATIONS

International Search Report and Written Opinion dated Feb. 16, 2017 for Application No. PCT/US2016/059949.

*Primary Examiner* — Andrew Q Tran
(74) *Attorney, Agent, or Firm* — Patterson + Sheridan LLP

(57) ABSTRACT

Embodiments described herein generally relate to improved methods and solutions for cleaning a substrate prior to epitaxial growth of Group III-V channel materials. A first processing gas, which includes a noble gas and a hydrogen source, is used to remove the native oxide layer from the substrate surface. A second processing gas, $Ar/Cl_2/H_2$, is then used to create a reactive surface layer on the substrate surface. Finally, a hydrogen bake with a third processing gas, which includes a hydrogen source and an arsine source, is used to remove the reactive layer from the substrate surface.

20 Claims, 3 Drawing Sheets

Related U.S. Application Data

(60) Provisional application No. 62/281,761, filed on Jan. 22, 2016, provisional application No. 62/263,271, filed on Dec. 4, 2015.

(52) U.S. Cl.
CPC .... *H01L 21/0262* (2013.01); *H01L 21/02381* (2013.01); *H01L 21/02463* (2013.01); *H01L 21/02546* (2013.01); *H01L 21/02661* (2013.01); *H01L 21/30621* (2013.01); *H01L 21/67023* (2013.01)

(56) References Cited

U.S. PATENT DOCUMENTS

| | | |
|---|---|---|
| 7,651,948 B2 | 1/2010 | Kim et al. |
| 7,709,391 B2 | 5/2010 | Kuppurao et al. |
| 8,008,166 B2 | 8/2011 | Sanchez et al. |
| 8,093,154 B2 | 1/2012 | Zojaji et al. |
| 8,309,440 B2 | 11/2012 | Sanchez et al. |
| 8,445,389 B2 | 5/2013 | Zojaji et al. |
| 8,492,284 B2 | 7/2013 | Samoilov |
| 9,905,412 B2 * | 2/2018 | Yan .................. H01L 21/02065 |
| 2007/0111521 A1 | 5/2007 | Wilk |
| 2007/0181057 A1 | 8/2007 | Lam et al. |
| 2007/0286956 A1 | 12/2007 | Samoilov |
| 2011/0290176 A1 | 12/2011 | Samoilov |
| 2012/0034761 A1 | 2/2012 | Kuppurao et al. |
| 2013/0068390 A1 | 3/2013 | Sanchez et al. |
| 2013/0288480 A1 | 10/2013 | Sanchez et al. |
| 2015/0270122 A1 | 9/2015 | Tolle et al. |

* cited by examiner

METHODS AND SOLUTIONS FOR CLEANING INGAAS (OR III-V) SUBSTRATES

CROSS-REFERENCE TO RELATED APPLICATIONS

This application claims benefit of co-pending U.S. patent application Ser. No. 15/340,292, which claims benefit of U.S. patent application Ser. No. 62/263,271 filed Dec. 4, 2015, and U.S. Provisional Patent Application No. 62/281,761 filed Jan. 22, 2016, each of which is herein incorporated by reference.

BACKGROUND

Field

Embodiments of the present disclosure generally relate to manufacture of semiconductor devices. More specifically, improved methods and solutions are described for cleaning a substrate surface prior to epitaxial growth.

Description of the Related Art

Epitaxial growth is widely used in manufacturing semiconductor devices, display devices, and other devices. Before the epitaxial layer is deposited on the substrate, a surface cleaning process is performed to remove native oxides and/or other impurities from the deposition surface, and increase the quality of the epitaxial layer being formed.

Deposition of Group III-V elements may be advantageous in certain applications for silicon-based devices. For example, Group III-V elements may serve as a channel, or fin, material for sub-7 nanometer (nm) complementary metal-oxide semiconductor (CMOS) devices due to the low contact resistance, superior electron mobility and lower operation voltage. However, there are major challenges of growing III-V material on III-V, such as lattice mismatch, valence difference, thermal property differences, conductivity differences, and anti-phase defects.

The current wet or dry cleaning processes may not be suitable for reliable fabrication of next-generation devices with Group III-V materials, such as InP, InAs, GaAs and InGaAs because they are high power, high temperature (>600° C.) processes. Furthermore, they are not suitable for cleaning materials inside very small features (<7 nm), and they create a damaged surface layer.

Thus, there is a need in the art for improved methods and solutions for cleaning an InGaAs or III-V substrate prior to epitaxial growth of III-V channel materials.

SUMMARY

Embodiments described herein generally provide a method of cleaning a substrate surface. The method includes positioning a substrate having a native oxide layer thereon on a support in a chamber. A first processing gas, which includes a noble gas and a hydrogen source, may be introduced into the chamber. The first processing gas may be activated. The native oxide layer of the substrate may be contacted with the activated first processing gas to activate or partially remove the native oxide layer. After activation or partial removal of the native oxide layer, a second processing gas, $Ar/Cl_2/H_2$, may be introduced into the chamber. The second processing gas may be activated. The substrate may be contacted with the second processing gas to create a reactive surface layer. A third processing gas, which includes a hydrogen source and an arsine source, may be introduced into the chamber. Finally, the substrate may be contacted with the third processing gas to remove the reactive surface layer.

In another embodiment, a method of cleaning a substrate surface is provided. The method includes positioning a substrate having a native oxide layer thereon on a support in a first chamber. A first processing gas, which includes a noble gas and a hydrogen source, may be introduced into the first chamber. The first processing gas may be activated. The native oxide layer of the substrate may be contacted with the activated first processing gas to activate or partially remove the native oxide layer. After activation or partial removal of the native oxide layer, a second processing gas, $Ar/Cl_2/H_2$, may be introduced into the first chamber. The second processing gas may be activated. The substrate may be contacted with the second processing gas to create a reactive surface layer. The substrate may be transferred to a second chamber. A third processing gas, which includes a hydrogen source and an arsine source, may be introduced into the second chamber. Finally, the substrate may be contacted with the third processing gas to remove the reactive surface layer.

In yet another embodiment, a method of fabricating a substrate is provided. The method includes positioning a substrate having a native oxide layer thereon on a support in a first chamber. A first processing gas, $Ar/H_2$, may be introduced into a first chamber. The first processing gas may be ionized. The native oxide layer of the substrate may be contacted with the activated first processing gas to activate or partially remove the native oxide layer. After activation or partial removal of the native oxide layer, a second processing gas, $Ar/Cl_2/H_2$, may be introduced into the first chamber. The second processing gas may be activated. The substrate may be contacted with the second processing gas to create a reactive surface layer. The substrate may be transferred to a second chamber. A third processing gas, $H_2$/TertbutylArsine (TBA), may be introduced into the second chamber. The substrate may be contacted with the third processing gas to remove the reactive surface layer. Finally, a Group III-V channel material may be deposited over the substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods and solutions for cleaning substrate surfaces prior to epitaxial growth of Group III-V channel materials. Exemplary substrates for the method include InGaAs substrates. Variation in substrate surface contamination and roughness is managed using plasma dry cleaning and a thermal treatment at a lower temperature. A substrate is placed into a first processing chamber. A first precursor is flowed into the first processing chamber and activated with low energy and power, creating reactive sites on the substrate surface. Then low energy plasma is reacted with the substrate surface to create a reactive layer on the substrate surface. The substrate is then transferred into a second processing chamber with a low temperature. A second precursor is injected into the second processing chamber, removing the reactive layer and leaving a very clean substrate surface, which is ready for epitaxial growth of Group III-V channel materials. The first processing chamber may be an etch chamber, and the second processing chamber may be an epitaxial deposition chamber.

Figure 1:
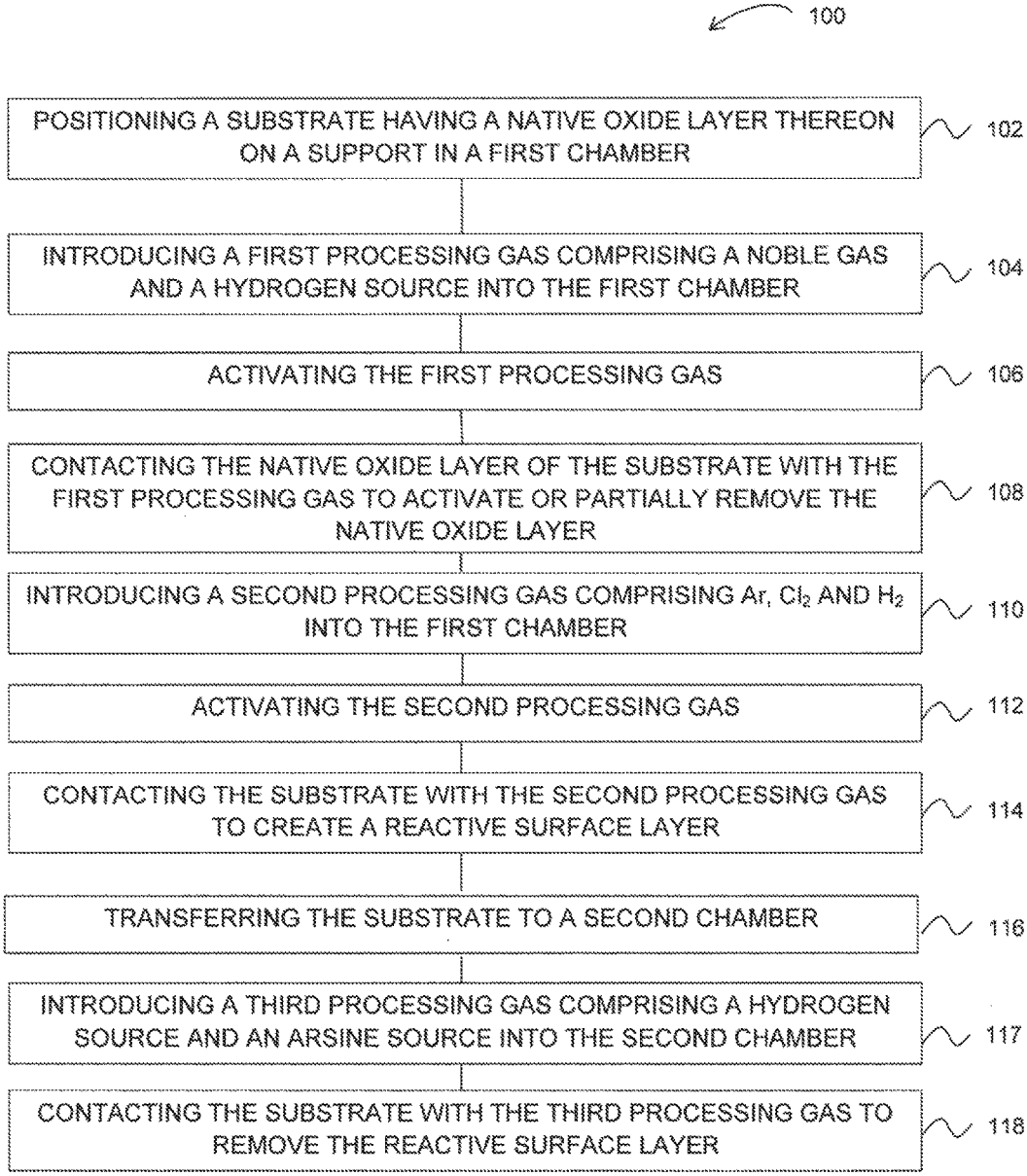
FIG. 1 is a flow diagram summarizing a method according to one embodiment described herein.
Figure 2A:
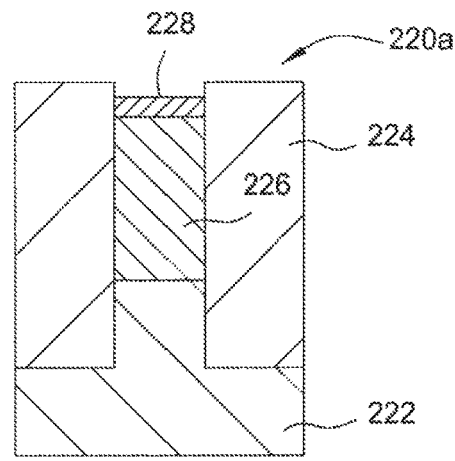
FIGS. 2A-2C depict schematic sectional side views of stages of fabrication of a device structure in accordance with the method of FIG. 1.
Figure 2B:
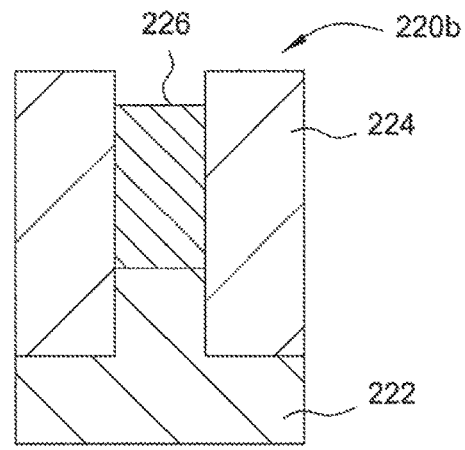
Figure 2C:
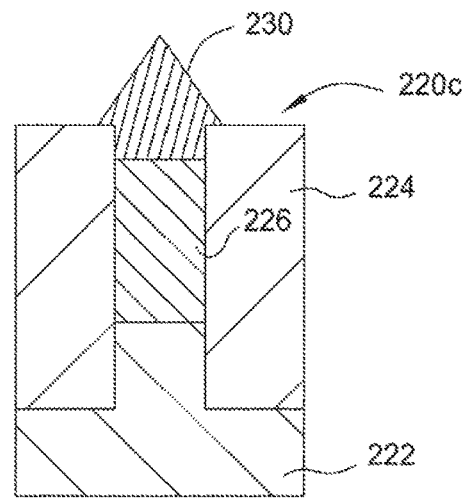

FIG. 1 is a flow diagram summarizing a method 100 for cleaning a substrate surface according to one embodiment described herein. Exemplary substrates for the method 100 include InGaAs (or III-V) substrates. FIGS. 2A-2C depict schematic sectional side views of stages of fabrication of a device structure in accordance with the method 100 of FIG. 1. The method 100 is described below in accordance with the stages of fabrication of a device structure as illustrated in FIGS. 2A-2C.

At operation 102, a substrate 222 is positioned in a first chamber. Prior to operation 102, as shown in FIG. 2A, a recess made from dielectric material 224 is formed on the substrate 222, and a buffer material 226 is deposited in the recess. There may be a native oxide layer 228 over the buffer material 226. The substrate 222 may be part of a device, such as a CMOS device with a critical dimension as low as 3 nm, for example 5 nm or 7 nm. Other devices, such as fin shaped field effect transistors (FinFETs) or the like may be used with the inventive methods provided herein.

The first process chamber is a plasma processing chamber. In one embodiment, the first process chamber is an etch chamber. In another embodiment, the first process chamber is vapor deposition chamber. The etch chamber may be a commercially available process chamber, such as the AdvantEdge™ Mesa™ Hardware Configuration, available from Applied Materials, Inc. of Santa Clara, Calif., or any suitable semiconductor process chamber adapted for performing epitaxial deposition processes.

The substrate 222 may be a silicon-containing substrate. The substrate may further comprise germanium (Ge), carbon (C), boron (B), phosphorous (P), or other known elements that may be co-grown, doped and/or associated with silicon materials. The recess forming dielectric material 224 may comprise one or more of silicon oxide (SiO), silicon dioxide ($SiO_2$), silicon nitride (SiN), silicon oxynitride (SiON), or other suitable materials that may be used to form a dielectric material. The dielectric material 224 may be deposited by various deposition processes. For example, the dielectric material 224 may be deposited by a chemical vapor deposition (CVD) process, which may be plasma enhanced. The recess formed in dielectric material 224 may be formed by patterning the dielectric material, using for example an etching process, to achieve the desired recess characteristics. Suitable etching methods include, but are not limited to, anisotropic dry etching or an in-situ dry clean process.

The buffer material 226 may comprise one or more Group III-V elements. In one embodiment, the buffer material 226 comprises InGaAs. Sometimes, a native oxide layer 228 forms on the surface of the buffer material 226. The native oxide layer 228 includes oxides (and suboxides) of indium (In), gallium (Ga), arsenic (As). For example, the native oxide layer may include indium oxide ($In_2O_3$), gallium oxide ($Ga_2O_3$), arsenic trioxide ($As_2O_3$), or arsenic pentoxide ($As_2O_5$).

At operation 104, a first processing gas comprising a noble gas, such as argon (Ar), and a hydrogen source gas, such as hydrogen gas ($H_2$) or methane, is introduced into the first chamber. In one embodiment, the first processing gas may be $Ar/H_2$. The first processing gas is continuously flowed into the chamber. In another embodiment, RF power, which may be pulsed, is coupled into the first processing gas for activation. The flow rate of the noble gas, in one embodiment $H_2$, into the first chamber is between about 5 sccm and about 300 sccm. The flow rate of a noble gas, in one embodiment Ar, into the first chamber is between about 100 sccm and about 1200 sccm. The first processing gas may be introduced by introducing the noble gas at a first flow rate, followed by introducing the hydrogen source gas at a second flow rate, or by introducing the hydrogen source gas at the second flow rate, and then introducing the noble gas at the first flow rate. The flow rate of the hydrogen source gas may be ramped to the second flow rate, and the flow rate of the noble gas may be ramped to the first flow rate. The first processing gas may also be introduced by introducing the noble gas and the hydrogen source gas at the same time as a mixture. The first processing gas is provided at a total flow rate between 100 sccm and 1500 sccm, and the flow rate of the first processing gas may be ramped to the total flow rate.

At operation 106, the first processing gas is activated. A target pressure of about 20 mT is established prior to activation. During this process, the chamber pressure is between about 5 mT and about 100 mT and the temperature inside the chamber is between about 30° C. and about 120° C. The temperature is controlled by heating the substrate at about 50° C. and heating the reactive surface at 65° C. Low radio frequency (RF) source and bias powers are applied to the chamber and coupled to the first processing gas to activate the first processing gas, producing ions and radicals in some cases. The source power may be between about 150 W and about 1000 W. The bias power may be between about 10 W and about 50 W. In operation, the Ar ions break the In—O, Ga—O and As—O bonds, creating reactive sites. Hydrogen radicals react with the O atoms. Thus, at operation 108, as shown in FIG. 2B, the native oxide layer 228 is removed.

At operation 110 a second processing gas, $Ar/Cl_2/H_2$, is introduced into the first chamber. RF power, which may be pulsed, is coupled into the second processing gas for activation. The pulse frequency range may be between about 1 KHz and about 10 KHz. The flow rate of $H_2$ into the first chamber is between about 0 sccm and about 300 sccm. The flow rate of $Cl_2$ into the first chamber is between about 5 sccm and about 300 sccm. The flow rate of Ar into the first chamber is between about 100 sccm and about 1200 sccm.

At operation 112, the second processing gas is activated. During this process, the chamber pressure is between about 5 mT and about 100 mT and the temperature inside the chamber is between about 30° C. and about 120° C. Low radiofrequency (RF) source and bias powers are applied to the chamber. The source power is between about 150 W and about 1000 W. The bias power is between about 0 W and about 30 W.

At operation 114, the substrate 222 is contacted with the second processing gas to create a reactive surface layer. In operation, the low energy $Ar/Cl_2/H_2$ second processing gas is reacted with the wafer surface, InGaAs in one embodiment, creating a reactive surface layer. Specifically, the reactive surface layer includes highly reactive, unbound hydride and chloride molecules.

At operation 116, the substrate 222 is transferred to a second chamber. The second process chamber is a deposition chamber. The deposition chamber may be a commercially available process chamber, such as the Centura® RP EPI reactor, available from Applied Materials, Inc. of Santa Clara, Calif., or any suitable semiconductor process chamber adapted for performing epitaxial deposition processes. At operation 117 a third processing gas comprising a hydrogen source and an arsine source is introduced into the chamber. In one embodiment, the third processing gas comprises $H_2$ and TertbutylArsine (TBA). The second chamber has a pressure of between about 10 T and about 600 T, and a temperature of between about 300° C. and about 800° C. In a preferred embodiment, the chamber temperature is ≤550° C.

At operation 118, the substrate 222 is contacted with the third processing gas to remove the reactive surface layer. In operation, the third processing gas is only introduced into the second chamber for a short period of time. For example, the processing gas is introduced to the chamber for between about 15 seconds and about 300 seconds. During this short time, the $H_2$ and TBA quickly react and remove the reactive surface layer, leaving a clean buffer layer, in one embodiment InGaAs, surface.

At the conclusion of the method 100, as shown in FIG. 2C, a channel material 230 may be epitaxially grown over the substrate surface, specifically over the buffer material 226. The channel material 230 may comprise any combination of at least a Group III element and a Group V element. In one embodiment, the channel material 230 comprises indium gallium arsenide (InGaAs). In another embodiment, the channel material 230 may comprise aluminum gallium arsenide (AlGaAs), indium arsenide (InAs), gallium antimonide (GaSb), or indium antimonide (InSb). In further embodiments, the channel material 230 may comprise a Group III-V material having high electron mobility and a good crystallographic structure. As a result of the surface preparation process of the method 100, the channel material 230 has a very low concentration of defects.

FIG. 1 shows one embodiment of a method for cleaning a substrate. In another embodiment, the operations of method 100 may occur in a single chamber. As described above, FIGS. 2A-2C depict schematic sectional side views of a device having recesses at various stages of the method 100. Alternatively, FIGS. 2A-2C may depict schematic sectional side views of a device having features, which may be trenches, contact holes, or other types of features.

Figure 3:
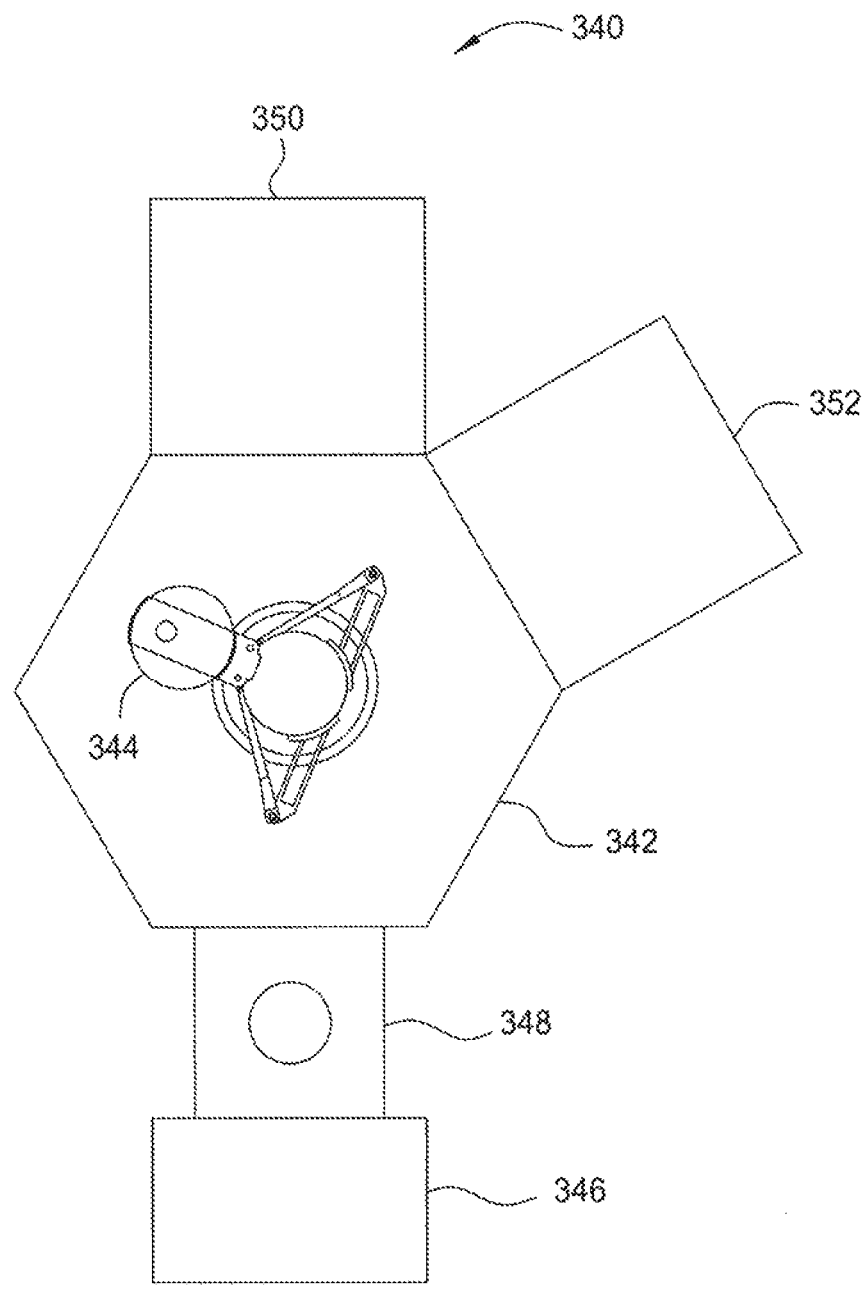
FIG. 3 is a schematic view of an apparatus for performing a method according to one embodiment described herein.

The methods disclosed herein can be performed in a single chamber or in multiple chambers of a single apparatus. FIG. 3 is a schematic view of an apparatus 340 for performing a method according to one embodiment described herein. More specifically, the apparatus 340 is a cluster tool for fabricating semiconductor devices according to the methods described above. A central portion of the apparatus 340 is a transfer chamber 342. Within the transfer chamber 342 is a wafer transferring mechanism 344. The wafer transferring mechanism 344 transfers a wafer from the first chamber 350 or the second chamber 352 to the load lock chamber 346 and vice versa. The first chamber 350 and second chamber 352 are connected to the transfer chamber 342. The load lock chamber 346 is connected to the transfer chamber 342 through a wafer alignment chamber 348. In a preferred embodiment, the first chamber 350 is an etch chamber and the second chamber 352 is a deposition chamber. The etch chamber may be a commercially available process chamber, such as the AdvantEdge™ Mesa™ Hardware Configuration, available from Applied Materials, Inc, of Santa Clara, Calif., or any suitable semiconductor process chamber adapted for performing epitaxial deposition processes. The deposition chamber may be a commercially available process chamber, such as the Centura® RP Epi reactor, available from Applied Materials, Inc. of Santa Clara, Calif., or any suitable semiconductor process chamber adapted for performing epitaxial deposition processes.

The method 100 begins at operation 102 by disposing a substrate 222, as shown in FIG. 2A, into the first chamber 350. A first processing gas is introduced into the first chamber 350, where it is ionized, as described in operations 104 and 106. The first processing gas contacts the native oxide layer 228 of the substrate 222 and actively or partially removes the native oxide layer 228, as explained in operation 108 and shown in FIG. 2B. A second processing gas is introduced into the first chamber 350, where it is ionized, as described in operations 110 and 112. The second processing gas contacts the substrate 222 and creates a reactive surface layer, as explained in operation 116. The substrate 222 is then transferred from the first chamber 350 to the second chamber 352 via the wafer transferring mechanism 344, as described in operation 116. A third processing gas is introduced into the second chamber, where it contacts the substrate to remove the reactive surface layer as described in operations 117 and 118, and as shown in FIG. 2C.

Use of the single apparatus 340 containing process chambers 350, and 352 allows for the various stages of the method of FIG. 1 to occur without breaking vacuum.

While FIG. 3 depicts one example of an apparatus having two process chambers for performing the methods described herein, other apparatus and chamber configurations are contemplated for performing the methods. For example, more than two process chambers may be attached to the transfer chamber 342 of the apparatus 340. The apparatus 340 may further include one or more of the following disposed about locations of the transfer chamber 342, in any order: deposition chambers, etch chambers, cleaning chambers, anneal chambers, oxidation chambers, plasma chambers, remote plasma chambers, thermal chambers, CVD chambers, physical vapor deposition (PVD) chambers, plasma-enhanced chemical vapor deposition (PECVD) chambers, rapid thermal processing (RTP) chambers, atomic layer deposition (ALD) chambers, or atomic-layer etch (ALE) chambers.

Thus, methods and solutions for cleaning a substrate prior to epitaxial growth of III-V channel materials are provided. The disclosed pre-epitaxial growth clean enables high selective epitaxial growth of Group III-V materials on an InGaAs substrate surface in sub 7 nm CMOS devices. Benefits of this disclosure include reduction of the oxygen level on the substrate surface to less than 5.0E+11 atoms/cm$^2$ without damage to the surface smoothness.

While the foregoing is directed to embodiments of the present disclosure, other and further embodiments of the disclosure may be devised without departing from the basic scope thereof, and the scope thereof is determined by the claims that follow.

What is claimed is:

1. A method for cleaning a substrate, comprising:
   introducing a first processing gas comprising a noble gas and a hydrogen source into a chamber;
   activating the first processing gas;
   exposing the substrate having a native oxide layer thereon to the activated first processing gas;
   introducing a second processing gas comprising $Cl_2$ and $H_2$ into the chamber;
   activating the second processing gas;
   exposing the substrate to the activated second processing gas;
   introducing a third processing gas comprising the hydrogen source and an arsine source into the chamber; and
   exposing the substrate to the third processing gas.

2. The method of claim 1, wherein the first processing gas comprises Ar and $H_2$.

3. The method of claim 1, wherein the third processing gas comprises $H_2$ and TertbutylArsine.

4. The method of claim 2, wherein Ar is introduced into the chamber at a flow rate of between about 100 sccm and about 1200 sccm.

5. The method of claim 1, wherein activating the first processing gas and activating the second processing gas occurs at a source power of between about 150 W and about 1000 W.

6. The method of claim 1, wherein activating the first processing gas occurs at a bias power of between about 10 W and about 50 W.

7. The method of claim 1, wherein activating the second processing gas occurs at a bias power of between about 0 W and about 30 W.

8. A method for cleaning a substrate, comprising:
   introducing a first processing gas comprising a noble gas and a hydrogen source into a first chamber;
   activating the first processing gas;
   exposing the substrate having a native oxide layer thereon to the activated first processing gas;
   introducing a second processing gas comprising $Cl_2$ and $H_2$ into the first chamber;
   activating the second processing gas;
   exposing the substrate to the activated second processing gas;
   transferring the substrate to a second chamber;
   introducing a third processing gas comprising the hydrogen source and an arsine source into the second chamber; and
   exposing the substrate to the third processing gas.

9. The method of claim 8, wherein the first processing gas comprises Ar and $H_2$.

10. The method of claim 8, wherein the third processing gas comprises $H_2$ and TertbutylArsine.

11. The method of claim 8, wherein a temperature of the first chamber is between about 30° C. and about 120° C.

12. The method of claim 8, wherein a temperature of the second chamber is between about 300° C. and about 800° C.

13. The method of claim 8, wherein a pressure in the first chamber is between about 5 mT and about 100 mT.

14. The method of claim 8, wherein a pressure in the second chamber is between about 10 T and about 600 T.

15. A method for fabricating a substrate, comprising:
   introducing a first processing gas comprising Ar and $H_2$ into a first chamber;
   activating the first processing gas;
   exposing the substrate having a native oxide layer thereon to the activated first processing gas;
   introducing a second processing gas comprising $Cl_2$ and $H_2$ into the first chamber;
   activating the second processing gas;
   exposing the substrate to the activated second processing gas;
   transferring the substrate to a second chamber;
   introducing a third processing gas comprising $H_2$ and TertbutylArsine into the second chamber;
   exposing the substrate to the third processing gas; and
   depositing an epitaxial material over a surface of the substrate.

16. The method of claim 15, wherein the first chamber is an etch chamber.

17. The method of claim 16, wherein the second chamber is a deposition chamber.

18. The method of claim 15, wherein the epitaxial material is a Group III-V material.

19. The method of claim 15, wherein the epitaxial material is InAs.

20. The method of claim 15, wherein a temperature of the second chamber is 550° C.

* * * * *